United States Patent [19]

Leitz

[11] Patent Number: 4,745,359
[45] Date of Patent: May 17, 1988

[54] METHOD AND APPARATUS FOR DETERMINING POLARITY OF A CAPACITOR

[75] Inventor: Eberhardt Leitz, Herzogenaurach, Fed. Rep. of Germany

[73] Assignee: Siemens Aktiengesellschaft, Berlin and Munich, Fed. Rep. of Germany

[21] Appl. No.: 805,508

[22] Filed: Dec. 5, 1985

[30] Foreign Application Priority Data

Dec. 17, 1984 [DE] Fed. Rep. of Germany ....... 3445993

[51] Int. Cl.$^4$ .................... G01R 19/14; G01R 11/52; G01R 27/26
[52] U.S. Cl. ................................. 324/133; 324/60 R
[58] Field of Search ............... 324/60 R, 60 C, 73 R, 324/73 AT, 133, 158 R, 158 D, 155 T; 209/574; 29/25.41, 25.42, 543, 832, 834; 198/394, 399, 395

[56] References Cited

U.S. PATENT DOCUMENTS 2,895,106 7/1959 Taunt .................................. 324/133

FOREIGN PATENT DOCUMENTS 3213110 10/1983 Fed. Rep. of Germany .

OTHER PUBLICATIONS

IBM Technical Disclosure Bulletin, vol. 26, No. 2, Jul. 1983, Roop et al., "Reverse Capacitor Tester".

Primary Examiner—Reinhard J. Eisenzopf
Assistant Examiner—Walter E. Snow
Attorney, Agent, or Firm—David N. Caracappa

[57] ABSTRACT

A method for polarity recognition of electronic components, and an arrangement for carrying out the method are presented. An application for the invention is in the automatic assembling of circuitboards by robots, wherein components present in the form of bulk material must be placed in order. If the polarity of the components is not evident from their exterior structural conventional mechanical ordering methods are not applicable. According to the invention, for components in which a terminal is connected with the electrically insulted foil electrode (2), the currents which, when a-c voltages are applied to the terminals (3, 4) of the component (1), flow capacitively across the outer foil (2) to a probe (6) are evaluated as signal for the polarity of the component (1). In an arrangement for carrying out this method, which comprises a circuit for the generation of mutually phase-shifted a-c voltages ($u_1$, $u_2$) and for the evaluation of the phase of measured signals picked up by means of a probe relative to the output signal, the probe (6) is adapted to conform to the exterior shape of the component (1) over a large area to form a sufficiently great capacitance. One adaption of the probe conforms to a negative mold (7) for the component (1) and can be applied to it or placed thereon.

21 Claims, 2 Drawing Sheets

METHOD AND APPARATUS FOR DETERMINING POLARITY OF A CAPACITOR

BACKGROUND OF THE INVENTION

This invention relates to a method for polarity recognition of electronic components, and, more particularly, it relates to a method wherein the polarity of the electronic components are not recognizable from the structural form and where an electrical terminal is connected to the outwardly electrically insulated outer foil of the component, in particular of electrolytic capacitors. In addition, the invention relates to an arrangement including a circuit and a specially designed probe wherein capacitance is used to determine the polarity of electronic components.

For automatic assembly of circuitboards, it is essential that the electronic components are delivered to the robot in an ordered arrangement. One conventional way this condition may be satisfied is through the form in which the components are supplied, for example by belting. If this is not the case, the circuitboard manufacturer must first arrange the components, normally in the form of bulk material, for which various conventional methods of multiple handling or vibratory conveyors may be used. In some components, in particular electrolytic capacitors, the electrical polarity is not evident from the exterior of the housing so that mechanical organizing methods are not applicable. Instead, optical methods may be used, which would help in particular also to evaluate the legend on the components. Such methods are, however, comparatively expensive. Alternatively, electrical methods may be used if a terminal of the component is connected with the electrically insulated outer foil electrode of the component. This is the case in particular with electrolytic capacitors.

It is, therefore, an object of the invention to provide a method of the above mentioned kind and an arrangement for carrying out the method with which in particular the polarity-correct handling of electrolytic capacitors by assembling robots is possible.

SUMMARY OF THE INVENTION

In accordance with the invention, the problem is solved in that the currents which, when a-c voltages are applied to the terminals of the component, flow capacitively across the outer foil to a probe are evaluated as an indication of the polarity of the component. Preferably, a-c voltages are applied alternately to the terminal connected with the outer foil electrode and the other terminals, the capacitive current between the probe and the terminal of the outer foil electrode being greater than the capacitive current between the probe and each of the other terminals of the component, wherein the difference signal of the currents is used for polarity determination. Advantageously, there may be connected to the electrical terminals of the component at the same time mutually phase-shifted a-c voltages, and as polarity signal the phase of the current capacitively flowing across the outer coating of the component to the probe may be indicated.

In an arrangement for carrying out the method which comprises a circuit for the generation of mutually phase-shifted a-c voltages and for the evaluation of the phase of the measured signals picked up by the probe relative to the output signal, the probe is adapted to the shape of the component over a large area for the formation of a sufficiently great capacitance. In particular, the shape of the probe conforms to serve as a negative mold for the component and can be positively fitted thereon.

With the invention, methods and a respective arrangement are provided which are suitable for use with robots. A robot arm designed for components and having axes of rotation can be completed with the described probe in a simple manner. After the information about the position of the component as obtained by the method according to the invention is at hand, the control of the robot arm is, if desired, made to rotate the arm by 180° before insertion of the component in the circuitboard. Thus a polarity-correct assembly of the components on circuitboards is always possible at no great expense.

BRIEF DESCRIPTION OF THE DRAWING

Further details and advantages of the invention will become evident from reading the following detailed description of embodiments with reference to the accompanying drawing.

In the drawing.

DETAILED DESCRIPTION

Figure 1:
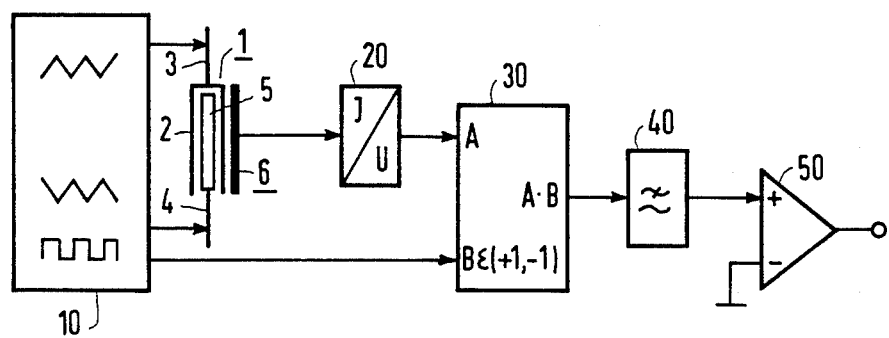
FIG. 1 is a block diagram of an arrangement in accordance with the invention illustrating the new method.

Throughout the drawing figures identical components are identified with the same reference numerals. In some cases, the figures are described jointly to facilitate an understanding of the invention.

Figure 2:
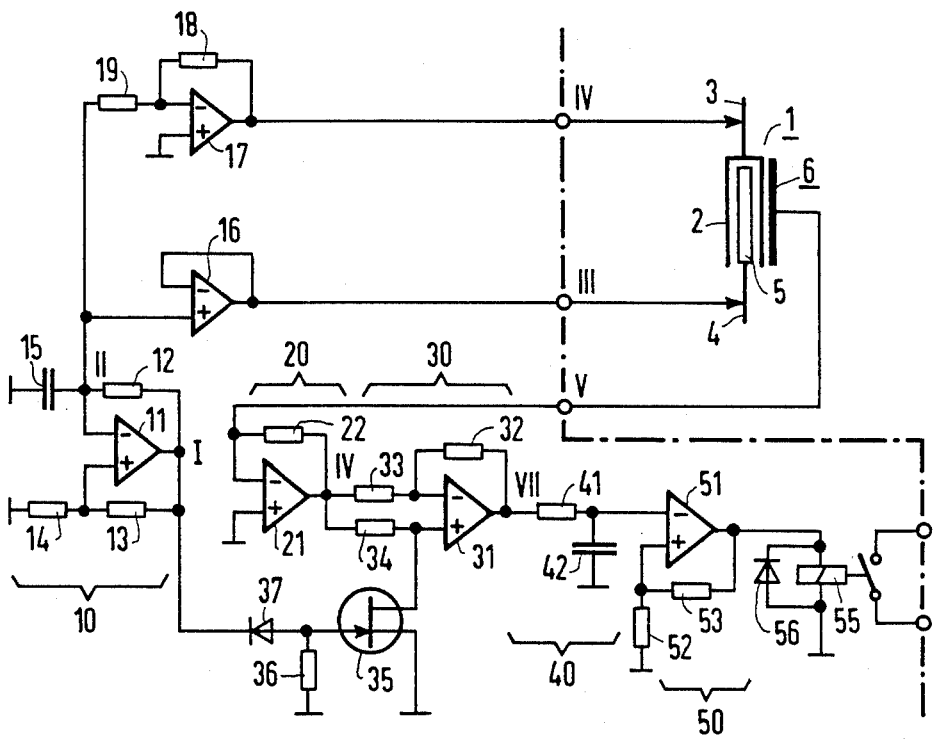
FIG. 2 is an illustrative circuit for use in implementing the method.

In FIGS. 1 and 2, 1 generally denotes an electronic component. A prerequisite for the feasibility of the method described in the following is that the component 1 has an outer foil 2 which is connected to terminal 3. The remaining terminal 4 connects to an electrode 5 situated in the interior region of component 1. These prerequisites are fulfilled in an electrolytic capacitor including an external cathode and internal anode. As a rule, the outer coating 2 of such a component 1 is electrically insulated from the outside housing of the component. Connectable to the component is a probe 6, which will now be described in detail.

If one applies to the anode of such a capacitor 1 a reference potential M and to the cathode an a-c voltage u, which, of course, must not exceed the permissible polarity reversal voltage, current will flow across the coupling capacitance between the cathode and the probe 6. But if one places the cathode on M and the anode on u, a smaller current will flow across the probe 6, the cathode acts as a shield and thus only the leakage capacitance between the anode and the probe 6 becomes active. From the magnitude of the current it can be seen, therefore, whether the cathode or the anode is connected to the voltage u, and this can be used for polarity indication. However, the evaluation of the current amplitude by comparison with a fixed value is uncertain, as the value of the capacitive current depends on the inexactly defined capacitance to the probe. It is more advantageous to connect the voltage u alternately to one first and then to the other terminal of the component. Next the current i is measured in each instance. The higher value of the two currents then identifies the measurement during which the voltage was connected to the cathode.

When using two a-c voltages $u_1$ and $u_2$, the two measurements can be carried out simultaneously. Advantageously the voltages $u_1$ and $U_2$ are a-c voltages of equal frequency and amplitude which are phase-shifted by 180° relative to each other. In this case, the phase of the probe current always corresponds to the phase of that voltage which is connected to the outer electrode and hence to the cathode. Here one must take into consideration the phase shift between voltage and current which is dependent on the capacitance between the probe and the terminals of the component.

For the implementation of this inventive method, there is shown in FIG. 1 a triangle/square waveform generator 10 which generates a square-wave standard signal and two corresponding triangular-wave signals, one of which is shifted in phase by one hundred eighty degrees. The signals have the same frequency of less than or equal to 5 kHz, for example 1 kHz, and the same amplitude of less than or equal to one volt, for example 0.5 volts. The two triangular-wave signals are applied to the terminals 3 and 4 of component 1.

The current signal capacitively picked up by probe 6 is sent via a current-voltage converter 20 to one input A of a synchronous rectifier 30. The other input B receives the square-wave signal. Depending on the square-wave signal, signal A is amplified with +1 or −1, and the signal thus processed is sent to a low-pass filter 40, which together with the synchronous rectifier 30 is intended to eliminate in particular the influence of stray pickups at power supply frequencies. Thereafter the processed signal goes to a comparator 50, which after comparison of the signal with a comparison value provides a polarity signal usable for control purposes.

In the circuit according to FIG. 2, the generator 10 is formed specifically by a multivibrator configuration comprising an amplifier 11 with respective wire wound resistors 12 to 14 and capacitance 15, which in like manner generates a triangular signal as well as a phase-synchronous approximate triangular signal. The triangular signal is applied via an amplifier 16 connected to serve as an impedance transformer to one terminal 4 of the component 1 under that and via an inverter including a feedback operational amplifier 17 and respective wiring resistors 18 and 19 to the other terminal 3 of the component 1 under test.

The current capacitively picked up by the probe 6 at the testpiece 1 goes via a current-voltage converter 50 including an operations amplifer in feedback with the resistor 22 to the synchronous rectifier 30. The latter operates in known configuration of an operational amplifier 31 which is connected with resistors 32 to 34; the second input of the operational amplifier 31 receives the square-wave signal of the multivibrator. To provide this square-wave signal, there is connected to this input a field effect transistor 35 with resistor 36 and blocking diode 37 in the input branch.

Following the synchronous rectifier 30 is a low-pass filter 40 comprising resistor 41 and capacitance 42 as well as a Schmitt trigger as comparator including an operational amplifier 51 with resistors 52 and 53. The Schmitt trigger is followed by a relay 55 with parallel blocking diode 56, which relay serves for signaling and display of the polarity.

Figure 3:
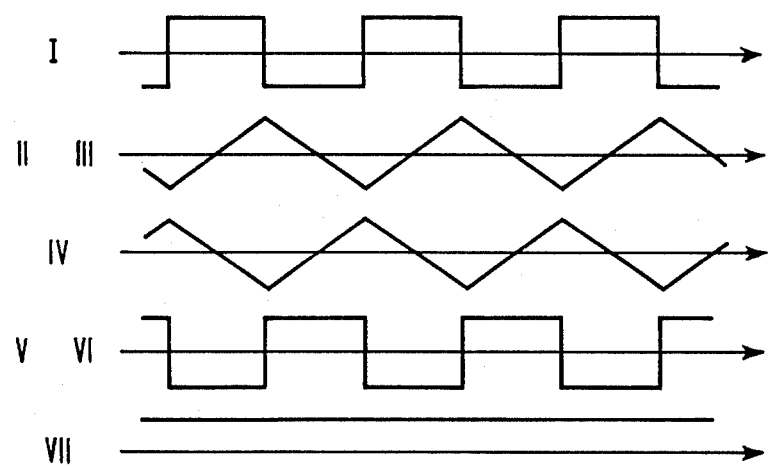
FIG. 3 is a pulse waveform diagram for demonstrating the operation of the circuit of FIG. 2.

The pulse diagram according to FIG. 3 illustrates the signals present at the circuit points 1 to VII of FIG. 2.

To complete the description of FIG. 2, the following explanations must be made:

The multivibrator generates at point I the square-wave voltage and at point II approximately a triangular voltage. The triangular voltage is supplied to the terminals 3 and 4 of component 1 via the impedance transformer and via the inverter. Due to the capacitance between the outer foil of component 1 and of the probe 6 and due to the leakage capacitance between the inner coating and the probe, current flows at point V of the circuit and serves as the virtual zero point, or virtual ground, of the current-voltage converter. As the terminals of the capacitor are connected to oppositely phased voltages, also the current at point V is composed of two oppositely phased components, of which the component deriving from the outer coating dominates. According to the equation $i = C \times du/dt$, the waveform of the current is rectangular and has the phase shown at point V if the outer foil is connected to the signal IV. If the outer foil is connected to the signal IV. If the component 1 is connected the other way round, there results a current flow in phase opposition. After the current-voltage conversion, the voltage signal VI occurs, which the synchronous rectifier 30 transforms into the d-c voltage signal VII. The polarity of this d-c voltage signal furnishes the desired information about the polarity of the component.

As the current or voltage occur at points V and VI is represented in idealized form, while in actual practice they are affected by interferences, such as line frequency and the like, the circuit of the synchronous rectifier 30 with following low-pass filter 40 is necessary for the elimination of these interferences. Thus only frequencies are passed which are equal to the control frequency on to point I or equal to an odd-numbered multiple thereof.

The output of the Schmitt trigger, connected as comparator, actuates the relay 55 in such a way that the relay contact is closed when the outer foil of the component is connected to the voltage IV.

Figure 4:
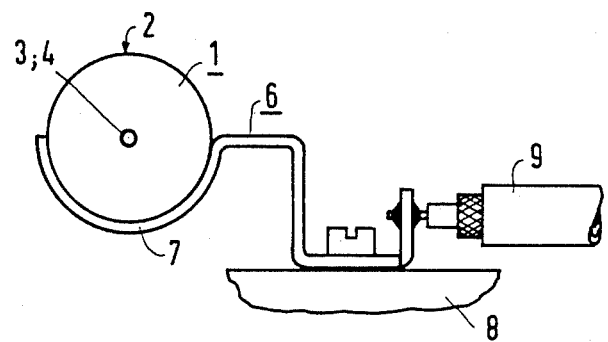
FIG. 4 is a side view depicting the form of an illustrative probe in accordance with the invention.

In FIG. 4, the probe 6 is a metallic shaped part whose shape serves as an appropriate negative mold 7 for the component 1 lying therein, with the terminals 3 and 4.

By virtue of the conforming shape 7 of probe 6 as high as possible a capacitance is developed with the outer foil electrode of component 1. Suitable for receiving the component is, for example, a flat strip of conductive material. Or the probe 6 may be compact in form which is placed on the component from above in particular in connection with a robot arm under spring pressure when gripping the component. In accordance with the existing requirements, the shaped part 7 of probe 6 is secured by screws in its back to an insulator 8, to which an inner conductor of a shielded line 9 is connected. The conducting parts of the probe 6, which do not contribute to the capacitance with the outer coating and are not shielded, are made as small as possible, to minimize interference from stray pickup.

The described method and respective arrangement may be used for polarity recognition of electrolytic capacitors which have an outer coating and also permit pole reversal voltages of normally 1 volt at a frequency of 1 kHz. These conditions generally exist in aluminum and tantalum electrolytic capacitors. With the described arrangement, in addition, the identification of the terminals for outer foil non-polarized capacitors is possible.

There has thus been shown and described a novel polarity determining arrangement for electronic components which fulfills all the objects and advantages sought therefor. Many changes, modifications, variations and other uses and applictions of the subject invention will, however, become apparent to those skilled in the art after considering the specification and the accompanying drawings which disclose embodiments thereof. All such changes, modifications, variations and other uses and applications which do not depart from the spirit and scope of the invention are deemed to be covered by the invention which is limited only by the claims which follow.

I claim:

1. A method for determining the polarity of a capacitor whose polarity is not determinable from the structural form of its exterior portion, said capacitor having an inner and an outer electrode arranged concentrically, two axial electrical terminals, and an outwardly electrically insulating coating, wherein one of said electrical terminals is connected to the outer electrode and the other one of said electrical terminals is connected to the inner electrode, said method comprisng the steps of:
    applying a-c voltages to the terminals of the capacitor;
    locating a probe extending over the exterior portion of the capacitor to produce a capacitive current between the outer coating and the probe in response to the applied voltages; and
    evaluating the value of the current to determine the polarity of the capacitor.

2. The method according to claim 1, wherein the step of applying voltages comprises the steps of:
    applying the voltages to the terminal connected to the outer electrode to produce the capacitive current having a first value;
    applying the voltages to the other terminal to produce the capacitive current having a second value;
    calculating the difference between the first and second values of the capacitive current; and
    using the difference of the currents to determine the polarity.

3. The method according to claim 1, wherein the step of applying voltages comprises the steps of:
    connecting mutually phase-shifted a-c voltages to respective electrical terminals of the capacitor at the same time; and
    using the phase of the capacitive current to determine the polarity of the capacitor.

4. The method according to claim 3, wherein the frequency and amplitude of the mutually phase-shifted a-c voltages are equal.

5. The method according to claim 3, wherein the phase shift of the mutually phase-shifted a-c voltages is 180°.

6. The method according to claim 4, wherein the phase shift of the mutually phase-shifted a-c voltages is 180°.

7. The method according to claim 3, wherein the mutually phase-shifted a-c voltages have triangular voltage waveforms.

8. The method according to claim 4, wherein the mutually phase-shifted a-c voltages have triangular voltage waveforms.

9. The method according to claim 5, wherein the mutually phase-shifted a-c voltages have triangular voltage waveforms.

10. The method according to claim 3, wherein the frequency of the a-c voltages is less than 5 kHz and the amplitude has a value of less than 1 volt.

11. The method according to claim 4, wherein the frequency of the a-c voltages is less than 5 kHz and the amplitude has a value of less than 1 volt.

12. Apparatus for determining the polarity of a capacitor whose polarity is not determinable from the structural form of its exterior portion, said capacitor having an inner and an outer electrode arranged concentrically, two axial electrical terminals, and an outwardly electrically insulating coating, wherein one of said electrical terminals is connected to the outer electrode and the other one of said electrical terminals is connected to the inner electrode, comprising:
    a circuit for the generation of mutually phase-shifted a-c voltages;
    means for applying said mutually phase-shifted voltages to respective electrical terminals of said capacitor;
    a probe, adapted for contacting a portion of said outwardly electrically insulating coating of said capacitor, for producing a measurement signal; and
    means for evaluating said measurement signal in response to the mutually phase-shifted signals and for generating a polarity representative signal; wherein the shape of the probe develops a sufficiently large capacitance over a large area of the exterior portion of the capacitor.

13. The apparatus according to claim 12, wherein the shape of the probe forms a negative mold for the capacitor and is adapted to be applied to or placed on the capacitor to provide a positive form fit.

14. The apparatus according to claim 12, further comprising a line terminal leading away from the probe which is electrically shielded to avoid line influence of leakage fields.

15. The apparatus according to claim 13, further comprising a line terminal leading away from the probe which is electrically shielded to avoid line influence of leakage fields.

16. The apparatus according to claim 12, wherein the circuit for the generation of the a-c voltages and the means for evaluating the measurement signals comprise:
    a multivibrator means for the generation of a square-wave signal and of a first triangular voltage synchronous thereto; and
    an inverter for reversing the phase of the first triangular voltage to generate a second voltage with a phase shift of 180°.

17. The apparatus according to claim 16, wherein the square wave signal of said multivibrator means forms a comparison signal.

18. The apparatus according to claim 17, wherein said means for evaluating further comprises a synchronous rectifier, including amplification means, for rectifying the measurement signal and amplifying it in response to the comparison signal supplied by the multivibrator.

19. The apparatus according to claim 18, wherein said means for evaluating further comprises a low-pass filter connected to the synchronous rectifier for eliminating interferences produced by line frequency.

20. The apparatus according to claim 19, wherein said means for evaluating further comprises a comparator connected to the low-pass filter for supplying the polarity representative signal.

21. The apparatus according to claim 20, further comprising a comparator connected to the low-pass filter for supplying the polarity representative signal.

* * * * *